(12) United States Patent
Chan et al.

(10) Patent No.: US 12,237,371 B2
(45) Date of Patent: Feb. 25, 2025

(54) METHOD FOR FORMING A SEMICONDUCTOR DEVICE

(71) Applicant: IMEC VZW, Leuven (BE)

(72) Inventors: Boon Teik Chan, Wilsele (BE); Hans Mertens, Leuven (BE); Eugenio Dentoni Litta, Leuven (BE)

(73) Assignee: IMEC VZW (BE)

( * ) Notice: Subject to any disclaimer, the term of this patent is extended or adjusted under 35 U.S.C. 154(b) by 575 days.

(21) Appl. No.: 17/476,747

(22) Filed: Sep. 16, 2021

(65) Prior Publication Data

US 2022/0093734 A1 Mar. 24, 2022

(30) Foreign Application Priority Data

Sep. 18, 2020 (EP) .................................... 20196933

(51) Int. Cl.
*H01L 29/06* (2006.01)
*H01L 29/786* (2006.01)

(52) U.S. Cl.
CPC .... *H01L 29/0669* (2013.01); *H01L 29/78687* (2013.01); *H01L 29/78696* (2013.01)

(58) Field of Classification Search
None
See application file for complete search history.

(56) References Cited

U.S. PATENT DOCUMENTS 9,842,914 B1 12/2017 Yeung et al.
10,074,575 B1* 9/2018 Guillorn ......... H01L 21/823821
10,170,484 B1 1/2019 Sung et al.
10,297,667 B1 5/2019 Yeung et al.
2013/0082303 A1* 4/2013 Cheng ................. H01L 21/7813
257/E29.089
2018/0090624 A1* 3/2018 Cheng ............... H01L 29/78687
2019/0067441 A1 2/2019 Yang et al.

OTHER PUBLICATIONS

P. Weckx et al., "Novel forksheet device architecture as ultimate logic scaling device towards 2nm," 2019 IEEE International Electron Devices Meeting (IEDM), 2019, pp. 36.5.1-36.5.4, doi: 10.1109/IEDM19573.2019.8993635.
European Search Report for EP application No. 20196933.4, dated Feb. 22, 2021.

* cited by examiner

*Primary Examiner* — Cory W Eskridge
(74) *Attorney, Agent, or Firm* — Christensen O'Connor Johnson Kindness PLLC

(57) ABSTRACT

A method for forming a semiconductor device is provided. The method comprises forming a device layer stack comprising an alternating sequence of lower sacrificial layers and channel layers, and a top sacrificial layer over the topmost channel layer, wherein the top sacrificial layer is thicker than each lower sacrificial layer; etching the top sacrificial layer to form a top sacrificial layer portion underneath the sacrificial gate structure; forming a first spacer on end surfaces of the top sacrificial layer portion; etching the channel and lower sacrificial layers while using the first spacer as an etch mask to form channel layer portions and lower sacrificial layer portions; etching the lower sacrificial layer portions to form recesses in the device layer stack, while the first spacer masks the end surfaces of the top sacrificial layer portion; and forming a second spacer in the recesses.

15 Claims, 7 Drawing Sheets

METHOD FOR FORMING A SEMICONDUCTOR DEVICE

CROSS-REFERENCE TO RELATED APPLICATIONS

The current application is a national phase application of European patent application number 20196933.4 filed Sep. 18, 2020, which documents are incorporated herein in their entireties.

TECHNICAL FIELD

The present inventive concept relates to a method for forming a semiconductor device.

BACKGROUND

Modern semiconductor integrated circuit technology includes horizontal channel transistors, of which the FinFET, which has a gate straddling a fin-shaped semiconductor channel portion, is one example. Other examples include the horizontal or lateral nanowire FET (NWFET) and nanosheet FET (NSHFET). These transistor structures typically include a source, a drain, a channel comprising one or more nanowire or nanosheet-shaped channel portions extending horizontally (i.e. along the substrate), and a gate stack. In a gate-all-around (GAA) design, the channel portions may extend through the gate stack such that the gate stack wraps all-around one or more of the channel portions. Spacers of a dielectric material ("inner spacers") may be provided at locations between the gate stack and the source/drain regions. Inner spacers may reduce a capacitive coupling between the source/drain regions and the gate.

Fabrication methods for horizontal NWFET or NSHFET devices may be based on processing of a semiconductor layer stack of alternating sacrificial layers and channel layers. The processing may (e.g. after sacrificial/dummy gate removal) comprise a step of etching away sacrificial layer material above and below the channel layers to form "released" channel layers (e.g. of a nanowire or nanosheet shape), to subsequently be surrounded by the gate stack. Inner spacers may during such a channel release step serve an additional purpose of masking the source/drain regions from the etching.

The "forksheet" device is a design allowing an n-type NSHFET and a p-type NSHFET to be provided adjacent to each other in relatively close proximity, each controlled by a fork-shaped gate structure and separated by an insulating wall. The insulating wall may be formed between the p- and n-type device region before gate patterning. The wall may separate the p-gate trench from the n-gate trench, allowing a much tighter n-to-p spacing.

A forksheet device fabrication method may comprise forming a pair of layer stacks of alternating sacrificial layers and channel layers and being separated by a trench. The trench may be filled with insulating material to form the insulating wall. Processing steps such as gate patterning, source/drain region epitaxy, channel release etc. may then follow.

To allow for an increased height of the insulating wall above the topmost channel layer of each layer stack, a top sacrificial layer may be provided over the topmost channel layer of each layer stack, the top sacrificial layer having a greater thickness than the lower sacrificial layers of the layer stacks. However, it has been realized by the inventors that a thicker top sacrificial layer may complicate formation of inner spacers, in particular forming of inner spacers below as well as above the topmost channel layer.

SUMMARY

An objective of the present inventive concept is hence to provide an improved method for forming a semiconductor device comprising inner spacers, which method is compatible with forksheet device fabrication, wherein the layer stacks to be processed have a top sacrificial layer thicker than the lower sacrificial layers. It is further contemplated that such a method may have an applicability beyond forksheet device fabrication. More generally, it is hence an objective to provide a method for forming a semiconductor device comprising (inner) spacers, which method is compatible with fabrication processes for other types of semiconductor devices (e.g. horizontal NWFETs or NSHFETs) involving processing of sacrificial/channel layer stacks having a top sacrificial layer thicker than the lower sacrificial layers. Further and alternative objectives may be understood from the following.

According to an aspect of the present inventive concept there is provided a method for forming a semiconductor device. The method comprises: forming a device layer stack on a substrate, the device layer stack comprising an alternating sequence of lower sacrificial layers and channel layers, and a top sacrificial layer over a topmost one of the channel layers, wherein the top sacrificial layer is thicker than each lower sacrificial layer; forming a sacrificial gate structure extending across the device layer stack; etching the top sacrificial layers while using the sacrificial gate structure as an etch mask to form a top sacrificial layer portion underneath the sacrificial gate structure; forming a first spacer on opposite sidewalls of the sacrificial gate structure and on end surfaces of the top sacrificial layer portion; etching the channel layers and lower sacrificial layers while using the sacrificial gate structure and the first spacer as an etch mask to form channel layer portions and lower sacrificial layer portions underneath the sacrificial gate structure; etching the lower sacrificial layer portions to form recesses in the device layer stack on opposite sides of the sacrificial gate structure, while the first spacer masks the end surfaces of the top sacrificial layer portion; and forming a second spacer in the recesses, comprising conformally depositing dielectric material and using an isotropic etch to etch the conformally deposited dielectric material such that end surfaces of the channel layer portions are exposed on opposite sides of the sacrificial gate structure and the dielectric material remains in the recesses to form the second spacer.

According to the inventive method, the first spacer masks the end surfaces of the top sacrificial layer portion while the lower sacrificial layer portions are etched to form the recesses. Thereby, the top sacrificial layer portion may be masked, and recesses be formed only at the lower sacrificial layer portions, i.e. between the channel layers and not at the top sacrificial layer portion.

Conceptually, the top sacrificial layer portion may accordingly to the method be considered to be incorporated into the sacrificial gate structure. This in turn allows inner spacer formation at the top sacrificial layer portion (by forming the first/gate spacer) to be decoupled from inner spacer formation at the lower sacrificial layers (by forming the second spacer). In other words, the first spacer may have a double function of defining a gate spacer (in the conventional meaning) of the sacrificial gate structure and an inner spacer at the top sacrificial layer. Meanwhile, the second spacer may define an inner spacer at the lower sacrificial layers.

Forming the second spacer by a conformal deposition of dielectric material and a subsequent isotropic etching thereof confers an additional advantage of avoiding etch attack on other structures of the device, such as the first spacer: Etching the conformally deposited dielectric material for the second spacer using an isotropic etch allows the dielectric material to be removed at a uniform rate (at least substantially). Hence, the structures covered by the dielectric material may remain covered from the etchants by the dielectric material substantially until the end surfaces of the channel layer portions are exposed, wherein the isotropic etching may be stopped. As may be appreciated this may also reduce requirements on etch selectivity for the dielectric material of the second spacer, e.g. with respect to the first spacer material.

The dielectric material forming the second spacer may be deposited with a thickness such that the recesses are pinched-off by the dielectric material. A (local) thickness of the dielectric material deposited in the recesses (as seen horizontally) may hence be greater than a (local) thickness (horizontally) of the dielectric material deposited on the end surfaces of the channel layer portions. The dielectric material may hence remain in the recesses to form the second spacers when the isotropic etching exposes the end surfaces of the channel layer portions.

A minimum thickness of the dielectric material forming the second spacer in order to achieve a pinch-off effect in a recess may be half the height of the recess (i.e. the length of the extension of the recess along the side of the lower sacrificial layer at the recess).

The term "topmost layer" may be used to refer to a layer (e.g. of the layers of the same type in the same device layer stack) that is closest to the top, i.e. farthest away from the substrate.

It is noted that the inventive method is related to a specific part of a method for forming a semiconductor device. However, the method may comprise preceding steps such as preparing the substrate and subsequent steps such as finalizing the semiconductor device into a transistor device, e.g. comprising forming a final gate stack and incorporating a back-end of line structure.

The method may advantageously be used to form nanosheet transistor structures comprising a stack of nanosheet channel portions (e.g. "forksheet" FET structures). The method is however not limited to transistor structures comprising a stack of nanosheet channel portions but is generally applicable to form transistor structures, e.g. field-effect transistor (FET) structures, comprising one or more channel layer portions of e.g. a nanowire- or nanosheet-shape.

The sacrificial and channel layers are layers of different semiconductor materials, wherein the material of the sacrificial layers may be removed or etched selectively to the material of the channel layers, or vice versa. A selective etch removes one material at a greater rate than another. For example, the material of the sacrificial layers may hence be removed in an etching process while at least partially preserving the material of the channel layers.

That is, the selective removal of the sacrificial layers may comprise etching the material of the sacrificial layers at a greater rate than the material of the channel layers. For example, the etch of the lower sacrificial layer portions to form recesses in the device layer stack may use a selective etch, such that end surfaces of the lower sacrificial layers may be etched back (laterally/horizontally) with respect to end surfaces of the channel layers.

The sacrificial layers as well as the channel layers may be epitaxial (e.g. epitaxially grown) semiconductor layers, e.g. of a sacrificial material and of a channel material, respectively. This enables high quality material layers with an advantageous degree of control of composition and dimensions. The sacrificial layers may instead be deposited, e.g. using CVD, as these are to be removed in further processing steps and thereby do not require such high quality.

The lower sacrificial layers may have a uniform thickness. This enables the formation of recesses of the same or similar size within which the second spacers may be uniformly formed, which in turn enables the second spacers to uniformly remain in the recesses. Furthermore, it enables a uniform removal of the lower sacrificial layer portions in a processing step, e.g. prior to gate stack formation as will be described below.

Similarly, the channel layers may have a uniform thickness, e.g. to enable a uniform current through the channel layer portions once the semiconductor device is finalized through further processing.

The sacrificial layers (i.e. bottom as well as top sacrificial layers) and the channel layers may be Si-comprising layers, wherein the sacrificial layers have a greater Ge-content than the channel layers. The sacrificial layers and the channel layers may each be SiGe-layers. Alternatively, the sacrificial layers may be SiGe-layers and the channel layers may be formed of Si-layers.

The sacrificial layers may be formed of $Si_{1-y}Ge_y$, and the channel layers may be formed of $Si_{1-z}Ge_z$, wherein y>z. A lower or zero Ge-content in the channel layers (i.e. y>z≥0) may facilitate selective processing, e.g. removal, of the sacrificial layers. A Ge-content of the sacrificial layers may advantageously be at least 20% greater than a Ge-content of the channel layers (i.e. y≥z+0.2). This further facilitates selectivity between the sacrificial layers and the channel layers.

The first spacer may be formed using a sidewall spacer deposition process. A first spacer material may be conformally deposited (using e.g. chemical vapor deposition (CVD), atomic layer deposition (ALD) or physical vapor deposition (PVD)) on exposed surfaces of the sacrificial gate structure and device layer stack. The first spacer material may then be subjected to an anisotropic etch, etching back (top-down) the first spacer material such that the first spacer material is removed from horizontally oriented surfaces but remain on the (vertically oriented) opposite sidewalls of the sacrificial gate structure and the end surfaces of the top sacrificial layer portion. The first spacer material may e.g. be formed by an oxide-, nitride- or carbide-based material (e.g. $SiO_2$, SiN, $AlO_x$, SiC, SiCO).

The dielectric material of the second spacer may be subjected to an isotropic etch selective to the dielectric material rather than the material of the first spacer. This selectivity allows the second spacer material to be removed from the exposed surfaces of the semiconductor device while minimally affecting the first spacer.

The dielectric material of the second spacer may e.g. be formed by an oxide-, nitride- or carbide-based material (e.g. $SiO_2$, SiN, $AlO_x$, SiC, SiCO). In order to achieve a selectivity between the first and second spacers, the dielectric material of the second spacer may be formed by using a different oxidizing agent than the first spacer material. For example, the first spacer material may be SiCO and the dielectric material may be $Si_3N_4$.

The dielectric material of the second spacer may further be formed by a combination of oxide-, nitride- or carbide-based materials, such as a dual-layer of first SiCO and then $Si_3N_4$. This allows for achieving further improved selectivity during etching of the isotropic etching.

After forming the second spacer, source and drain regions may be formed by epitaxially growing semiconductor material on the exposed end surfaces of the channel layer portions.

The sacrificial gate structure may act as a mask during the formation of the source and drain regions. The source and drain regions may thus be formed in a self-aligned manner with respect to the sacrificial gate structure.

As may be appreciated, the choice of semiconductor material may take the channel material into account. For instance, Si selective area epitaxy may be performed on Si channel layers.

After forming the second spacer, a gate stack may be formed by replacing the sacrificial gate structure with a gate stack.

This may be done by first selectively etching the sacrificial gate structure leaving a gate trench exposing a portion of the device layer stack (e.g. between the first spacer portions along mutually opposite sides of the gate trench) and subsequently depositing a gate metal in the gate trench. The first spacer may thus confine the etch to the sacrificial gate structure.

The etching of the top sacrificial layer may extend completely through the top sacrificial layer.

This allows the first spacer to cover the entire thickness of the top sacrificial layer. This enables the top sacrificial layer portion to be as high as the top sacrificial layer.

The device layer stack may further comprise an insulating interface layer between the top sacrificial layer and the topmost channel layer; wherein while etching the top sacrificial layer, the insulating interface layer acts as an etch stop.

The insulating interface layer acting as an etch stop counteracts over-etching into the topmost channel layer, thereby minimizing damage to non-sacrificial structures of the semiconductor device.

The forming of a first spacer may comprise conformally depositing a first spacer material and subsequently anisotropically etching the first spacer material such that the first spacer material is removed from horizontally oriented surfaces and remain on vertically oriented surfaces, the vertically oriented surfaces comprising both outer sidewalls of the device layer stack.

By forming the first spacer on the outer sidewall of the device layer stack, i.e. perpendicular to the extension of the sacrificial gate structure, the first spacer remaining on the sidewalls may act as confinement for a subsequent epitaxial growth of the source and drain regions in the direction perpendicular to the the extension of the sacrificial gate structure.

The channel layers and lower sacrificial layers may be formed by a stack of nanowires or by a stack of nanosheets.

The device layer stack may be a first device layer stack formed on a first device region of the substrate and the method may further comprise: forming a second device layer stack on a second device region of the substrate, the second device layer stack comprising an alternating sequence of lower sacrificial layers and channel layers, and a top sacrificial layer over a topmost one of the channel layers, wherein the top sacrificial layer is thicker than each lower sacrificial layer, the first and second device layer stacks being spaced apart by a trench filled with an insulating wall material to form an insulating wall; forming a sacrificial gate structure extending across the first and second device layer stacks and the insulating wall; etching the top sacrificial layers of the second device layer stack while using the sacrificial gate structure as an etch mask to form a top sacrificial layer portion underneath the sacrificial gate structure; etching the channel layers and lower sacrificial layers of the second device layer stack while using the sacrificial gate structure and the first spacer as an etch mask to form channel layer portions and lower sacrificial layer portions underneath the sacrificial gate structure; and etching the lower sacrificial layer portions to form recesses in the second device layer stack on opposite sides of the sacrificial gate structure, while the first spacer masks the end surfaces of the top sacrificial layer portions.

All of the above disclosed examples, details and advantages may be applied also to the second device layer stack in an analogous manner. For example, forming a gate stack by replacing the sacrificial gate structure with a gate stack may enable a gate stack extending across the first and second device layer stacks and the insulating wall. The gate stack may comprise different work function metals (WFMs) (e.g. n-type WFM and p-type WFM) on each side of the wall. In another example, the sacrificial gate structure is separated into separate sections, whereby the gate stack is formed as separately addressable gate structures.

The first and second device regions of the substrate may be adjacent to each other, wherein the insulating wall may be formed at the boundary of the first and second device regions.

The insulating wall may provide physical and electrical isolation between the first and second device layer stacks and their respective sacrificial gate structure sections. The insulating wall may be formed by filling a trench between the device layer stacks with an insulating wall material, e.g. an oxide such as SiCO. The thickness of the top sacrificial layers may define the height of the insulating wall above the topmost channel layers.

The insulating wall may be formed between the first and second device regions to be finalized into p- and n-type device regions. Accordingly, a relatively small complementary transistor structure may be achieved while enabling that the p- and n-type device regions are formed separate from each other.

According to the inventive method, the insulating wall is masked by the first spacer while etching the channel and lower sacrificial layers of each device layer stack and while forming recesses.

The insulating wall may act as a partition between the sacrificial gate structures of the device layer stacks. Moreover, the insulating wall may facilitate confining the source and drain epitaxy for the first device layer stack to the first device region, and the source and drain epitaxy for the second device layer stack to the second device region, i.e. reducing a risk of merging of the sources and drains of the transistor structures.

Furthermore, the insulating wall may enable a reduced sensitivity to mask edge placement errors (EPE) since the sacrificial gate structures may be self-aligned with the respective channel regions of the device stacks.

After forming the second spacer, the source and drain regions may be formed by epitaxially growing semiconductor material on the exposed end surfaces of the channel layer portions; wherein source and drain regions of the first device layer stack may be n-doped and the source and drain regions of the second device layer stack may be p-doped.

As previously described, the insulating wall combined with differently doped channel layers allows for a relatively small complimentary transistor structure to be finalized. In this case, the first device region comprises an NFET structure and the second device region comprises a PFET structure.

The forming of a first spacer may comprise conformally depositing a first spacer material and subsequently anisotropically etching the first spacer material such that the first spacer material is removed from horizontally oriented surfaces and remain on vertically oriented surfaces, the vertically oriented surfaces comprising an outer sidewall of each of the first and second device layer stacks.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

DETAILED DESCRIPTION

The following disclosure is drafted using terms and examples of a forksheet device, though the inventive concept is applicable to other types of semiconductor devices, such as any form of horizontal channel NSH- or NWFET.

In particular, a forksheet device makes use of a top sacrificial layer that is thicker than each lower sacrificial layer in order to define a height of an insulating wall. Such an insulating wall may be used in other semiconductor devices and the thickness of the top sacrificial layer may introduce similar challenges, as discussed in the introductory parts of the description.

Figure 1A:
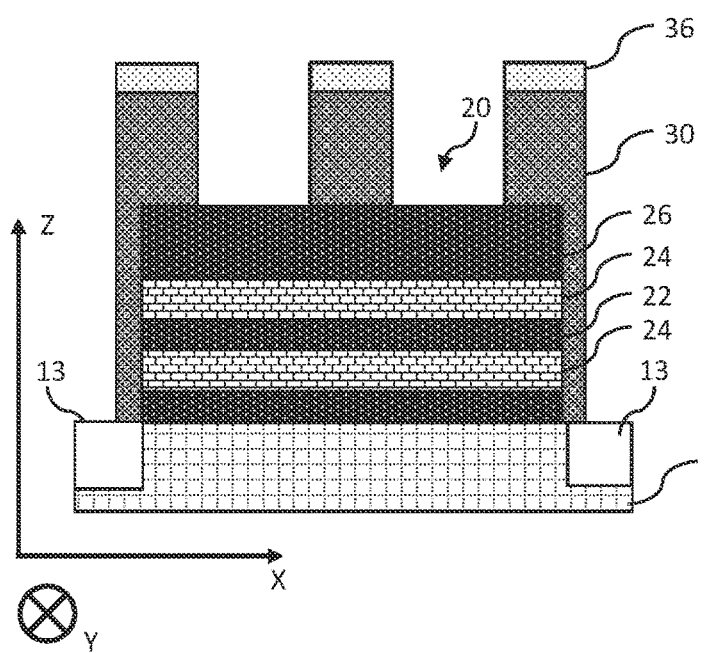
FIG. 1a is a cross-sectional view of a semiconductor device comprising a device layer stack on a substrate with a sacrificial gate structure extending across the device layer stack.

FIG. 1a is cross-sectional view of a semiconductor structure comprising a device layer stack 20 on a substrate 10 with a sacrificial gate structure 30 extending across the device layer stack 20 in a direction perpendicular to the cross-sectional view, i.e. in the Y direction.

Directions X and Y indicate a first and a second horizontal direction, respectively (along the substrate 10). Direction Z indicates a vertical or bottom-up direction (normal to the substrate 10). The cross section is taken along the XZ-plane.

The substrate 10 may be of a conventional type, such as a substrate suitable for complementary metal-oxide semiconductor (CMOS) processing and comprising (as a topmost layer) a semiconductor layer of a composition allowing forming of the device layer stack thereon. The substrate 10 may for instance be a semiconductor bulk substrate such as a Si substrate, a germanium (Ge) substrate or a silicon-germanium (SiGe) substrate. Other examples include a semiconductor-on-insulator (SOI) type of substrate such as a Si-on-insulator substrate, a Ge-on-insulator substrate or a SiGe-on-insulator substrate.

The device layer stack 20 comprises a top sacrificial layer 26 on top of the topmost channel layer 24 on top of an alternating sequence of two lower sacrificial layers 22 and a channel layer 24. The alternating sequence of a lower sacrificial layer 22 and a channel layer 24 may in other embodiments continue with any number of layers.

The lower sacrificial layers may have a thickness of 5-15 nm, such as 7 nm. The lower sacrificial layers may have a uniform thickness.

The top sacrificial layer is thicker than each lower sacrificial layer. The top sacrificial layer may have a thickness of 15-50 nm, such as 25 nm.

The channel layers have a thickness of 5-15 nm, such as 10 nm. The channel layers may have a uniform thickness.

The device layer stack 20 may as shown be surrounded by shallow-trench insulation (STI) regions 13.

Each sacrificial gate structure 30 extends across the device layer stack 20 in a direction perpendicular to the cross-sectional view. Each sacrificial gate structure 30 may as shown comprise a hard mask material as a gate cap 36 that was previously used for patterning the sacrificial gate structure 30.

A sacrificial gate structure 30 may act as a place holder for and define a shape for a (functional) gate stack of the completed device. A functional gate stack may be formed in a Replacement Metal Gate (RMG) process, by replacing a sacrificial gate structure 30 with a stack of gate dielectric, and one or more gate metals. FIG. 1a illustrates three sacrificial gate structures 30 formed across the layer stack 20. However, more generally any number of sacrificial gate structures 30 may be provided, and one or more thereof may be replaced with gate stacks.

The regions between the sacrificial gate structures 30, i.e. the portions of the device layer stack 20 that are not covered by a sacrificial gate structure 30, defines where the source and drain regions are to be formed. As such, a finalized transistor device may have a source and drain region on either side of a gate stack. The finalized transistor device further comprises channels running below the gate in the horizontal direction of FIG. 1a between the source and drain regions.

The layered structure of the device layer stack 20 allows forming of a finalized transistor structure having a respective channel region comprising a number of vertically distributed channel layer portions, the number corresponding to the number of channel layers in the device layer stack 20.

Additionally, a portion of the top sacrificial layer 26 below the middle sacrificial gate structure 30 may also be replaced with the gate stack, as will be further described below.

Figure 1B:
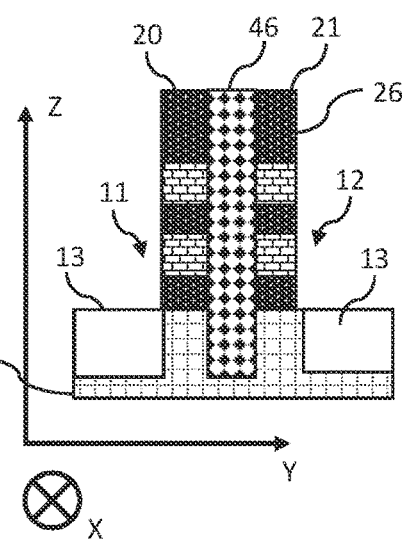
FIG. 1b is a different cross-sectional view of a semiconductor device comprising a first and second device layer stack on a first and second device region of a substrate with an insulating wall between them.

FIG. 1b is a different cross-sectional view of the semiconductor structure of FIG. 1a. In this view, it is apparent that the semiconductor structure comprises a first and second device layer stack 20, 21 on a first and second device region 11, 12 of the substrate 10, respectively. The cross-section of FIG. 1b is perpendicular to the cross-section of FIG. 1a (i.e. along the YZ-plane) and taken where a sacrificial gate structure is not present.

The first and second device region 11, 12 and the first and second device layer stacks 20, 21 are separated by an insulating wall 46. The insulating wall 46 is formed in a trench of the substrate 10. The insulating wall 46 may extend along the entire height of the first and second device layer stacks 20, 21, with a top surface at least substantially flush with the top surface of the top sacrificial layer 26. The trench may for example be formed with a width in a range from 5 nm to 20 nm.

The first and second device layer stacks 20, 21 may be formed by patterning a structure of sequentially deposited sacrificial and channel material layers, e.g. a stack of SiGe sacrificial material layers and (epitaxial) Si channel material layers as one example. The first and second device layer stacks 20, 21 may e.g. be patterned to form the respective device layer stacks, separated by a trench. Single- as well as multiple-patterning techniques may be employed, e.g. self-aligned double patterning (SADP), or quadruple patterning (SAQP) or some other conventional self-aligned multiple patterning (SAMP) technique. The first and second device layer stacks 20, 21 may be patterned to form fin-shaped layer stacks, each comprising channel layers 24 in the form of channel nanosheets, i.e. nanosheet-shaped channel layers, thereby allowing forming of nanosheet-based transistor structures. A nanosheet may by way of example have a width (e.g. as seen across the length of the channel region) in a range from 10 nm to 30 nm and a thickness in a range from 3 nm to 10 nm. It is also possible to pattern the device layer stacks 20, 21 such that the channel layers form nanowire-shaped layers. A nanowire may by way of example have a thickness similar to the example nanosheet however with a smaller width, such as 3 nm to 10 nm.

The insulating wall 46 may be formed after forming the first and second device stacks 20, 21 by filling the trench of the substrate 10 between the device layer stacks 20, 21 with an insulating wall material, e.g. an oxide such as SiN, SiCO, SiCN or SiOCN. The insulating wall material may be conformally deposited before being etched isotropically or anisotropically (i.e. in a top-down direction) to remove the deposited insulating material outside the trench. The insulating wall material may be deposited with a thickness such that the insulating wall material deposited at the respective sidewalls of the trench join to "pinch-off" and thus fill the trench. By etching, the insulating material may be removed outside of the trench but preserved in the trench to form the insulating wall 46.

FIGS. 2a-i illustrate method steps for forming a semiconductor device, applied to the semiconductor structure depicted in FIGS. 1a-b. In particular, the figures illustrate results of sequential processing steps.

Figure 2A:
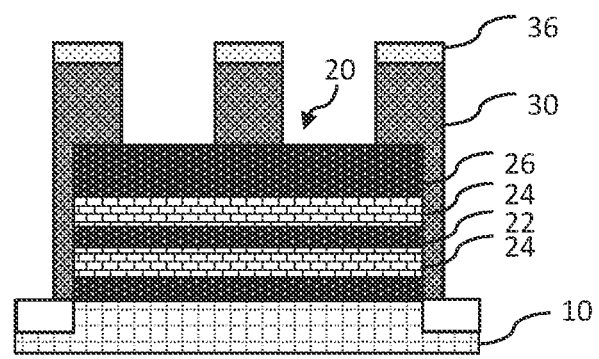
FIGS. 2a-i illustrate method steps for forming a semiconductor device.
Figure 2B:
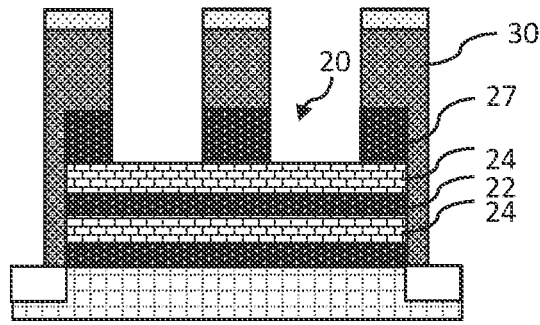
Figure 2C:
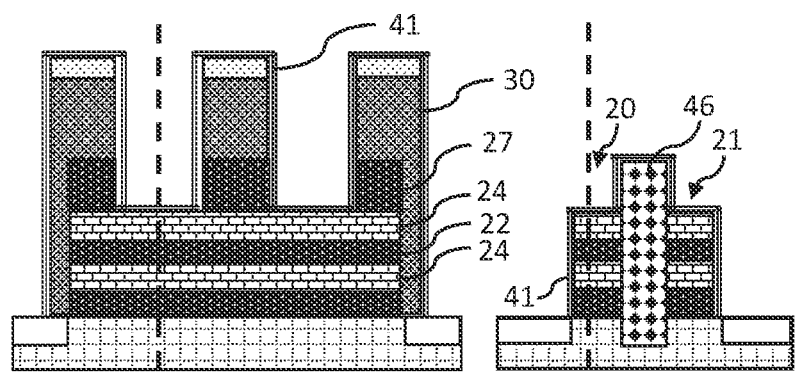
Figure 2D:
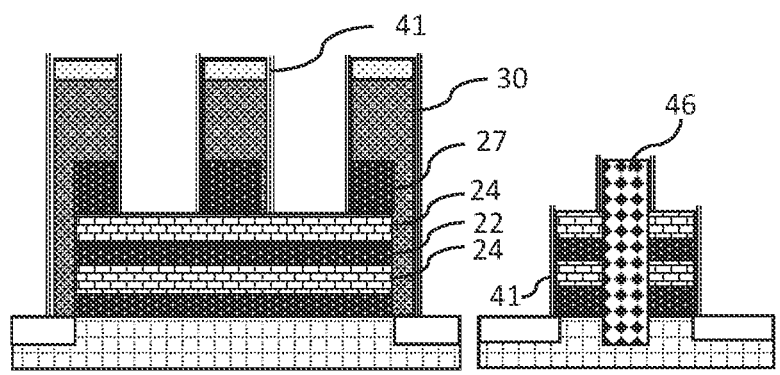
Figure 2E:
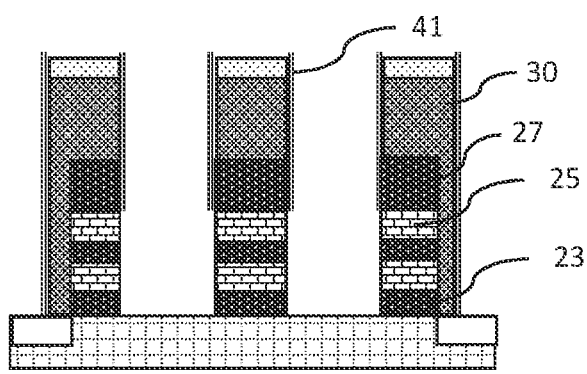
Figure 2F:
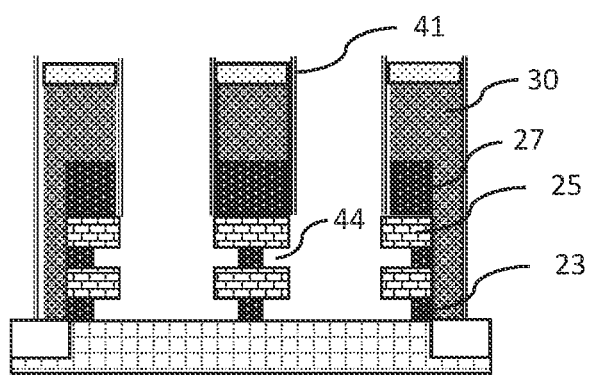
Figure 2G:
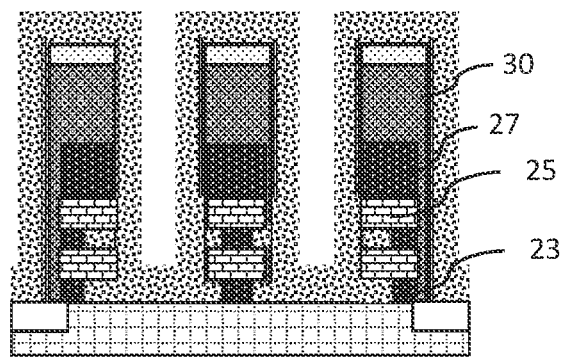
Figure 2H:
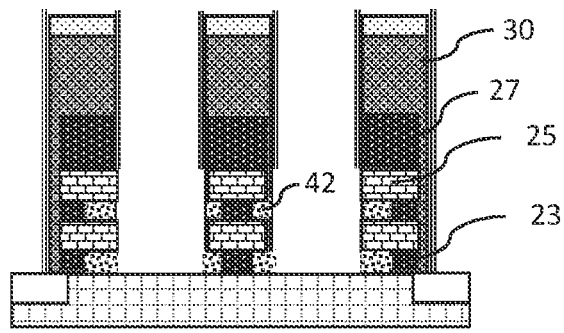
Figure 2I:
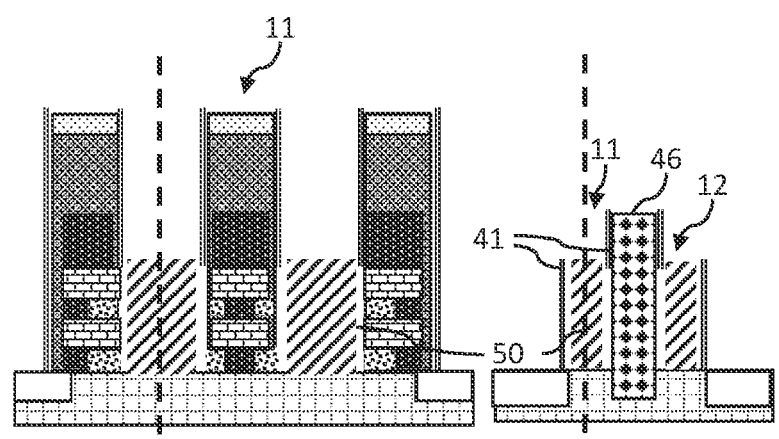

FIGS. 2a-i all show a cross-section along the direction of channels of the finalized transistor device. FIGS. 2c, 2d and 2i further show a cross-section perpendicular to the other cross-section, across an insulating wall 46 of the structure. These cross-sections correspond to the same cross-sections as in FIGS. 1a-b.

FIG. 2a shows the same semiconductor structure as FIG. 1a, thus depicting the result of forming a device layer stack 20 on a substrate 10, the device layer stack 20 comprising an alternating sequence of lower sacrificial layers 22 and channel layers 24, and a top sacrificial layer 26 over the topmost channel layer, wherein the top sacrificial layer 26 is thicker than each lower sacrificial layer 22.

A sacrificial gate structure 30 has further been formed extending across the device layer stack 20. The sacrificial gate structure 30 may be formed in a manner which per se is known in the art, i.e. by patterning a layer of e.g. amorphous Si (e.g. using SADP or SAQP). Portions of the mask (e.g. of hard mask material such as SiO and/or $Si_3N_4$) used for the patterning may remain on the sacrificial gate structure 30 as gate caps 36.

FIG. 2b shows the result of etching the top sacrificial layer while using the sacrificial gate structure 30 as an etch mask to form a top sacrificial layer portion 27 underneath the sacrificial gate structure 30. The exposed (i.e. not covered by the sacrificial gate structure 30) top surfaces of the top sacrificial layer are thus etched back. As may be better understood from the following, the top sacrificial layer portions 27 may hence be considered as being incorporated into the sacrificial gate structures 30.

This etching may be an anisotropic etch to etch the device layer stack 20 in a top-down direction. Any suitable dry etching process or wet etching process, or combination of a dry and a wet etching process, may be employed, such as reactive ion etching (RIE).

As shown in FIG. 2b, the etching may extend through the entire thickness of the top sacrificial layer. In some embodiments, as will be discussed in relation to FIGS. 5a-b, the device layer stack 20 may comprise an insulating interface layer to act as an etch stop during this process, in order to protect the topmost channel layer 24 from being etched.

FIG. 2c shows the result of conformally depositing a first spacer material on exposed surfaces of the sacrificial gate structure and device layer stack. The dashed lines correspond to where the different cross-sections have been taken with respect to each other.

The first spacer material may further be deposited on outer sidewalls of the first and second device layer stacks 20, 21, as seen in the rightmost cross-section.

FIG. 2d shows the result of an anisotropic etch, etching back (top-down) the first spacer material such that the first spacer material is removed from horizontally oriented surfaces but remain on the vertically oriented surfaces, thereby forming a first spacer 41 on opposite sidewalls of the sacrificial gate structure 30 and on end surfaces of the top sacrificial layer portion 27.

Due to the conformal nature of the deposition of the first spacer material, first spacer material may as shown further be deposited on outer sidewalls of the first and second device layer stacks 20, 21 in FIG. 2c (i.e. sidewalls of the respective device layer stacks facing away from the insulating wall 46). Accordingly, subsequent to the anisotropic etch, first spacer material may remain to form the first spacer 41 also on the outer sidewalls of the device layer stacks.

FIG. 2e shows the result of etching the channel layers and lower sacrificial layers while using the sacrificial gate structure 30 and the first spacer 41 as an etch mask to form channel layer portions 25 and lower sacrificial layer portions 23 underneath the sacrificial gate structure 30.

This etching may be an anisotropic etch adapted to etch the device layer stack in a top-down direction. Any suitable dry etching process may be employed, such as RIE.

The exposed (i.e. not covered by the sacrificial gate structure and/or the first spacer) top surfaces of the channel layers and lower sacrificial layers are etched. The etching process may comprise alternating different types or etchants, for example after the topmost channel layer is etched through, a different etchant may be used to etch the subsequent lower sacrificial layer. The use of different etchants may alternate as the materials of the device layer stack alternates.

While the top sacrificial layer portion 27 may be made from the same material as the lower sacrificial layer, the top sacrificial layer portion 27 is masked from being etched by both the sacrificial gate structure 30 and the first spacer 41.

FIG. 2f shows the result of etching the lower sacrificial layer portions 23 to form recesses 44 in the device layer stack on opposite sides of the sacrificial gate structure 30, while the first spacer 41 masks the end surfaces of the top sacrificial layer portion 27.

Each of the recesses 44 is surrounded by channel layer portions 25 above and/or below and an etched-back end surface of a lower sacrificial layer portion 23 at one side. Each of the recesses 44 may have a uniform depth, wherein the depth enables the second spacer to be formed there with sufficient thickness. The recesses may be 3-10 nm deep, such as 7 nm deep.

The exposed end surfaces of the lower sacrificial layer portions 23 (i.e. not covered by the sacrificial gate structure 30 and/or the first spacer 41) are etched. The etch may be selective for the lower sacrificial layer portion 23 rather than the channel layer portion 25, thereby more of the lower sacrificial layer portions 23 are etched back than the channel layer portions 25, forming lateral recesses 44 bordered by the channel layer portions 25.

The etching may be an isotropic etch process (i.e. non-directional), thus enabling a lateral etch-back of the end surfaces of the lower sacrificial layer portion 23. Any suitable dry etching process or wet etching process, or combination of a dry and a wet etching process, may be employed.

FIG. 2g shows the result of conformally depositing a dielectric material on exposed surfaces of the sacrificial gate structure 30 and device layer stack.

As the recesses have a higher degree of surface to volume ratio than the rest of the semiconductor structure, they may be pinched-off by the dielectric material such that a local thickness of the dielectric material deposited in the recesses may be greater than a local thickness of the dielectric material deposited on the end surfaces of the channel layer portion 25. Hence, the recesses may be filled after depositing a relatively thin layer of the second spacer material.

FIG. 2h shows the result of using an isotropic etch to etch the conformally deposited dielectric material such that end surfaces of the channel layer portions 25 are exposed on opposite sides of the sacrificial gate structure 30 and the dielectric material remains in the recesses to form the second spacer 42.

The isotropic etch may be selective for the dielectric material of the second spacer 42. The geometry of the recesses may cause the recesses to remain covered from the etchants by the dielectric material substantially until the end surfaces of the channel layer portions 25 are exposed, wherein the isotropic etching may be stopped. Therefore, by timing the end of the isotropic etch, only the dielectric material in the recesses may be left after the isotropic etch, thereby forming the second spacer 42. In the schematic illustration of FIG. 2h, the recesses and the second spacers 42 are shown as structures with substantially straight profiles. However, as may be appreciated the recesses may in practice have an inner sidewall with a curved profile, while the second spacers 42 may be formed with a curved or crescent shape.

FIG. 2i shows the result of forming source and drain regions 50 by epitaxially growing semiconductor material on the exposed end surfaces of the channel layer portions. The dashed lines correspond to where the different cross-sections have been taken with respect to each other.

Forming source and drain regions may comprise epitaxially growing semiconductor material, which may or may not be doped, for instance through in-situ doping, implantation doping or diffusion doping.

As the first spacer 41 was formed on the outer sidewalls of the device layer stack in FIG. 2c, the first spacer 41 may act as lateral confinement for the epitaxial growth of source and drain regions 50, while the insulating wall 46 may confine the epitaxial growth (laterally) within the first device region 11.

The first spacer 41 may further remain on the insulating wall 46, i.e. on the sidewalls of the insulating wall 46 exposed after removing the top sacrificial layer. This effectively widens the insulating wall 46, which may extend the overlay margin when forming source and drain contacts on the source and drain regions 50 on either side of the insulating wall 46, which may be formed e.g. using lithography.

Source and drain regions 50 may be formed in the second device region 12 in a similar manner as in the first device region 11. If the source and drain regions 50 are formed with the same type of doping in both the first and second device region 11, 12, they may be formed in parallel on either side of the insulating wall 46. The first device layer stack may be masked while forming source and drain regions 50 in the second device region 12 and vice versa, as will be discussed further in relation to FIGS. 4a-d.

In a finalized transistor structure, the channel portions in the middle section of the semiconductor device act as channels between the source and drain regions 50. The source and drain regions 50 may be doped to define whether an NFET or PFET device is to be formed.

Figures 3A, 3B:
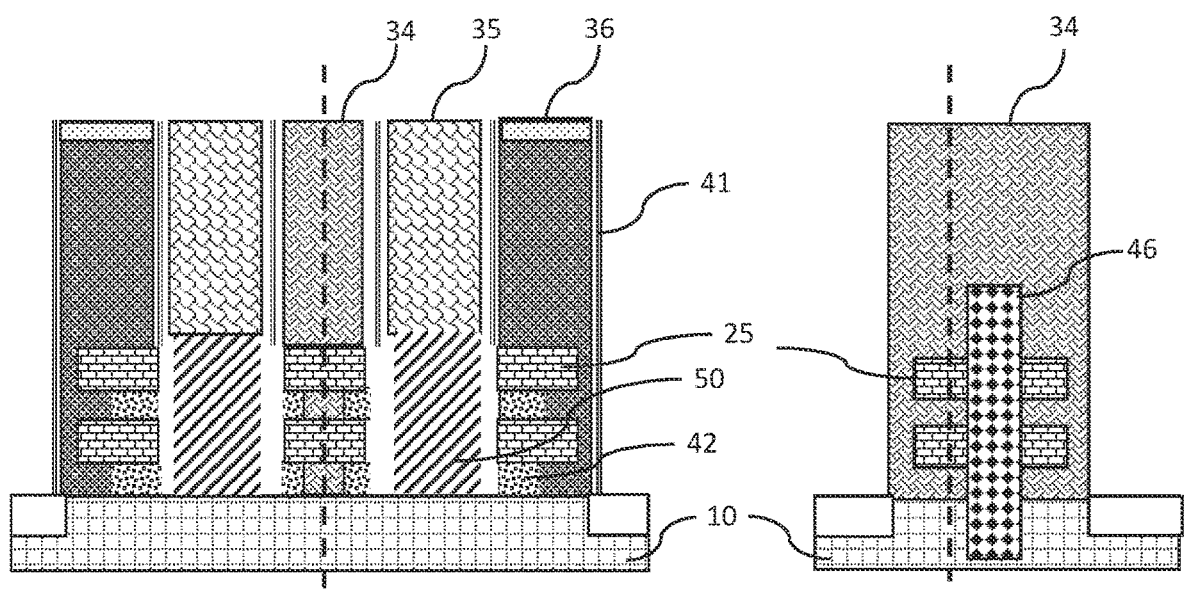
FIGS. 3a-b illustrate a finalized transistor device.

FIG. 3a is a cross-sectional view of a finalized transistor structure. The dashed line corresponds to where the cross-section of FIG. 3b has been taken.

The sacrificial gate structures may be replaced with gate stacks 34 by first selectively etching the sacrificial gate structures leaving gate trenches between the first spacer 41 and subsequently depositing a gate metal in the gate trenches to form the gate stacks 34.

The resulting gate stack 34 replacing the middle sacrificial gate structure of the semiconductor device may thereby act as a gate for the channels below.

The first spacer 41 may laterally confine the etch to the sacrificial gate structure. The first spacer 41 may be preserved in this process and remain as an electrically insulating gate spacer in a finalized transistor device.

The gate stacks 34 may be formed in a conventional RMG-process. A cover material 35 may be deposited to cover the source and drain regions 50 and surround the sacrificial gate structures. The cover material 35 may be an insulating material, such as an oxide, e.g. silicon oxide, or another gap fill dielectric material, deposited, planarized and recessed, e.g. by chemical mechanical polishing (CMP) and/or etch back. The CMP and/or etch back may proceed to also remove any gate cap 36 comprised in the sacrificial gate structure, thus revealing an upper surface of the sacrificial gate structure.

The sacrificial gate structure may thereafter be removed to form a gate trench extending across the first and second layer stacks and the insulating wall 46 and comprising a respective trench portion on either side of the insulating wall 46.

After removing the sacrificial gate structure, "released" channel layer portions may be defined by selectively removing lower and upper sacrificial layer portions from the gate trench. As the lower and top sacrificial layer materials are different from the channel layer material, the sacrificial layer portions may be removed by a selective etching process. For example, an HCl-based dry etch may be used to remove SiGe sacrificial layer material with a greater Ge-content than a Si or SiGe channel layer material. However, other appropriate etching processes (e.g. wet etching processes) are also known in the art and may also be employed for this purpose. Upper and lower surfaces of the "released" channel layer portions may be exposed within the respective gate trench portions, extending between respective source/drain regions 50. Accordingly, the final gate trench may be defined by the space left by the removal of the top sacrificial layer portion, the lower sacrificial layer portions and the sacrificial gate structure As may be appreciated (see also FIG. 3*b*), the channel layer portions may due to the presence of the insulating wall 46 be "partly released" in the sense that their upper and lower surfaces as well as outer sidewall surfaces are laid bare while their inner sidewall surfaces (i.e. facing the insulating wall 46) are not laid bare but are covered by the insulating wall 46.

The cover material may be an insulating material, such as an oxide, e.g. silicon oxide, or another gap fill dielectric material, deposited, planarized and recessed, e.g. by chemical mechanical polishing (CMP) and/or etch back. The CMP and/or etch back may proceed to also remove any gate cap comprised in the sacrificial gate structure, thus revealing an upper surface of the sacrificial gate structure.

During the removal of the sacrificial layer portions, the second spacers 42 may provide masking of the semiconductor material of the source and drain regions 50 from any etching chemistries employed.

FIG. 3*b* is a different cross-sectional view of the finalized transistor structure of FIG. 3*a*. The cross-section of FIG. 3*b* is perpendicular to the cross-section of FIG. 3*a* and taken where a gate stack 34 is present. The dashed line corresponds to where the cross-section of FIG. 3*a* has been taken.

Subsequent to the removal of the sacrificial gate structure, a respective gate stack 34 (comprising a replacement metal gate) may be formed in the respective gate trench portions on either side of the insulating wall 46. The gate stack 34 may (e.g. due to the presence of the insulating wall 46 and the resulting partial release of the channel region layer portions) have a fork-like shape on either side of the insulating wall 46, with a number of prongs extending along and between the channel layer portions 25.

The second spacers 42 may serve to provide an increased electrical isolation and a reduced capacitive coupling between each source/drain region 50 and adjacent gate stack 34.

Each gate stack 34 may have a composite structure comprising a gate dielectric layer (such as a high-k dielectric e.g. $HfO_2$, HfSiO, LaO, AlO or ZrO) on the channel region layer portions, one or more effective WFM layers on the gate dielectric layer (e.g. an n-type WFM such as TiAl or TiAlC and/or a p-type WFM such as TiN or TaN), and optionally a gate fill metal (such as W, Al, Co or Ru). The WFM layers may be conformally deposited e.g. by ALD. The gate fill metal may for instance be deposited by CVD or PVD.

In more detail, forming the gate stacks may comprise depositing the gate dielectric layer in the gate trench portions. Subsequently, the p-type WFM (or n-type WFM) may be deposited in gate trench portions. The deposition of the p-type (or n-type) WFM may be followed by an etch-back in a top-down direction, in which the p-type (or n-type) WFM is recessed to a level below, at or slightly above an upper surface of the insulating wall 46. A mask layer may be deposited, such as SoC or other organic spin-on, and etched back for instance by dry etching to a target level. The etched back mask layer may then be used as a mask while p-type (or n-type) WFM on surfaces above the target level (such as surfaces outside of the gate trench) is removed by for example isotropic etching, e.g. a wet metal etch.

A trench mask may subsequently be formed above a first one of the gate trench portions wherein the p-type (or n-type) WFM may be removed from the other/second gate trench portion by etching, the trench mask and the insulating wall 46 thus acting as a combined vertical and lateral etch mask for the p-type (or n-type) WFM in the first (or second) gate trench portion.

Subsequently an n-type (or p-type) WFM may be deposited in at least the second (or first) gate trench portion, optionally both.

The gate fill metal may subsequently be deposited to fill a remaining space in the first and second gate trench portions. The gate fill metal may be etched back (top-down) to obtain final gate stacks 34 of a desired height. The etch back may as shown in FIG. 3*b* performed such that the respective gate stacks 34 form electrically disconnected gate stacks, separated by the insulating wall 46. It is however also possible to limit the etch back such that the gate stacks 34 remain connected across the insulating wall 46. The gate stacks 34 may thus designate electrically connected parts of a common gate stack. This may be suitable configuration for e.g. a CMOS inverter.

The method may proceed with contact formation (for the gate stacks 34 and the source/drain regions 50 and routing layer formation, as per se is known in the art, to incorporate the transistor structures into a functioning circuit.

FIGS. 4*a*-*d* illustrate alternative method steps for forming a semiconductor device with complementarily doped source and drain regions. In particular, the figures illustrate results of sequential processing steps.

Figure 4A:
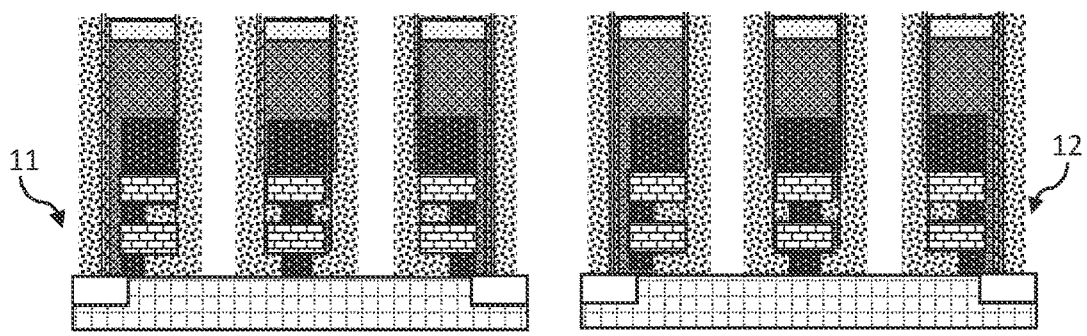
FIGS. 4a-d illustrate method steps for forming a semiconductor device with complementarily doped source and drain regions.

FIG. 4*a* shows the result of a parallel process for forming a semiconductor device as shown in FIGS. 2*a*-*g*. The parallel processes have formed a first device layer stack on a first device region 11 of a substrate and a second device layer stack on a second device region 12 of the substrate, the first and second device layer stacks being spaced apart by a trench filled with an insulating wall material to form an insulating wall (not shown).

Figure 4B:
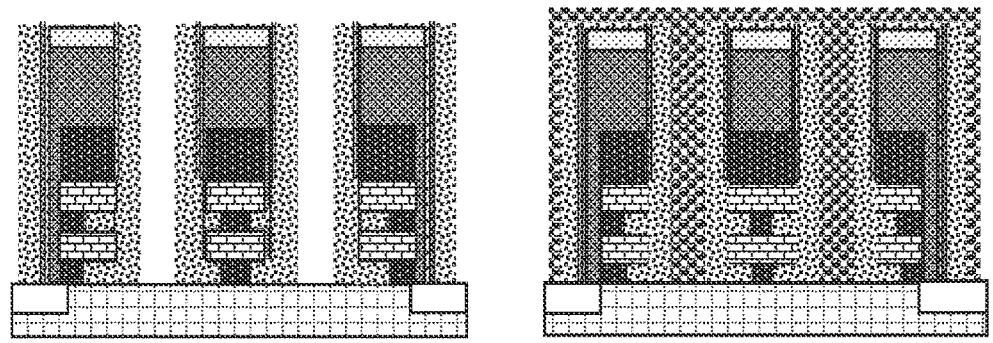

FIG. 4*b* shows the result of filling the second device region 12 with a relatively inert fill material in order to counteract the following processing steps affecting the second device layer stack.

Figure 4C:
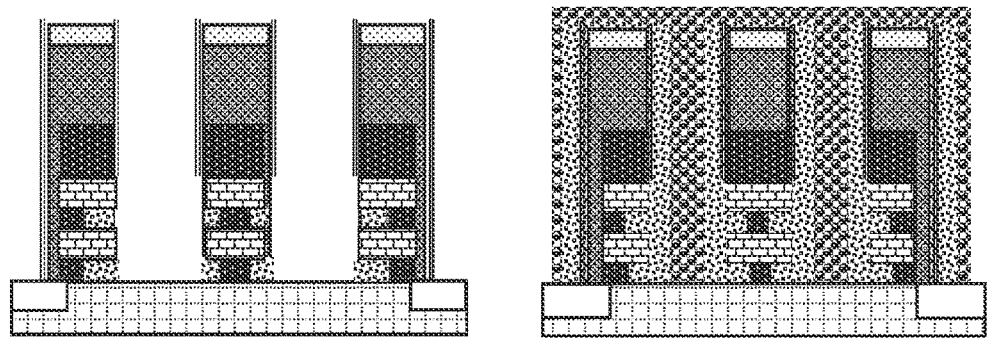

FIG. 4*c* shows the result of using an isotropic etch to etch the conformally deposited dielectric material such that end surfaces of the channel layer portions of the first device layer stack are exposed on opposite sides of the sacrificial gate structure and the dielectric material remains in the recesses to form the second spacer. This step corresponds to the step of FIG. 2*h*.

Figure 4D:
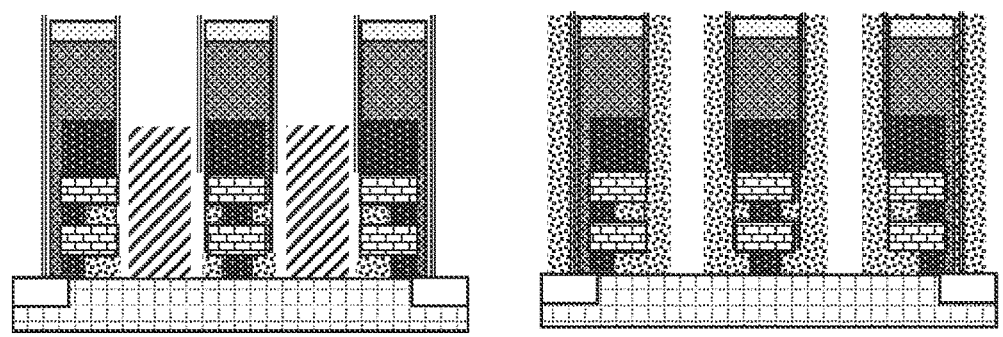

FIG. 4*d* shows the result of forming source and drain regions in the first device layer stack by epitaxially growing semiconductor material on the exposed end surfaces of the channel layer portions of the first device layer stack.

Subsequently, after the fill material is removed, the processing steps of FIGS. 4*b*-*d* may be repeated while inverting the processing of the first and second device layer stacks to achieve a complimentary transistor structure once finalized.

Figure 5A:
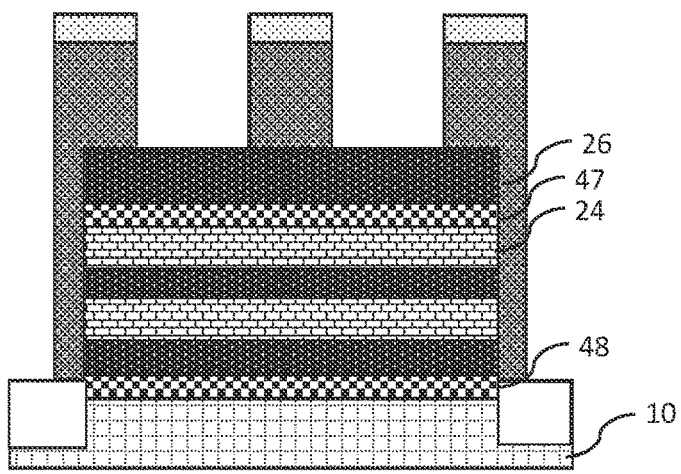
FIG. 5a is a cross-sectional view of a semiconductor device comprising an insulating interface layer and a bottom insulating layer.

FIG. 5*a* is a cross-sectional view of a semiconductor structure similar to the one of FIG. 1*a*, further comprising an insulating interface layer 47 and a bottom insulating layer 48.

The device layer stack may comprise an insulating interface layer 47 between the top sacrificial layer 26 and the topmost channel layer 24. The insulating interface layer 47 may act as an etch stop when etching the top sacrificial layer 26. In other words, the insulating interface layer 47 masks the topmost channel layer 24 when etching the top sacrificial layer 26.

The insulating interface layer 47 may comprise a pad oxide or any suitable dielectric material such as $SiO_2$, SiN, SiCN or SiOCN. The insulating interface layer 47 may be 3-10 nm thick, such as 5 nm thick.

The device layer stack may be formed on a bottom insulating layer 48. The bottom insulating layer 48 is between the device layer stack and the substrate 10. The bottom insulating layer 48 may be submerged into the substrate 10 as shown in FIG. 2a or formed as part of the device layer stack.

The bottom insulating layer 48 may mitigate charge carrier leakage from e.g. the source, the drain or the channel into the underlying semiconductor substrate 10.

The bottom insulating layer 48 may act as an etch stop to counteract over-etching into the substrate 10 while etching the channel layers 24 and lower sacrificial layers of each device layer stack.

The bottom insulating layer 48 may comprise any suitable dielectric, such as $SiO_2$, SiN, SiCN or SiOCN. The bottom insulating layer 48 may be formed while forming the device layer stack or be a part of the substrate 10. The bottom insulating layer 48 may be 5-15 nm thick, such as 10 nm thick.

Figure 5B:
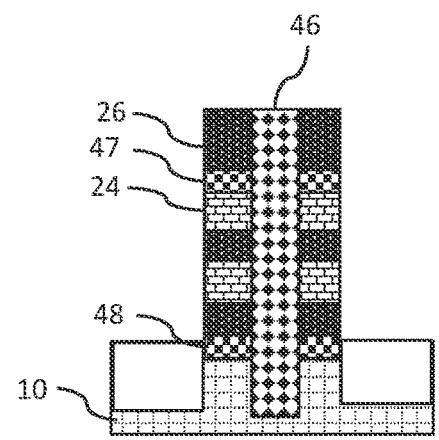
FIG. 5b is a different cross-sectional view of a semiconductor device comprising an insulating interface layer and a bottom insulating layer.

FIG. 5b is a cross-sectional view of the semiconductor device of FIG. 1b further comprising an insulating interface layer 47 and a bottom insulating layer 48. These insulating layers 47, 48 may be formed separately in each device region or jointly e.g. while forming the insulating wall 46 or while jointly forming the device stacks.

For example, the insulating interface layer 47 may be formed while forming the device layer stack by epitaxially growing or depositing a pad oxide or dielectric material after forming the topmost channel layer 24 and before forming the top sacrificial layer 26.

The insulating interface layer 47 may alternatively be formed while forming the insulating wall 46 by forming parts of the insulating wall 46 before the formation of the top sacrificial layers 26, forming the insulating wall material also on top of the topmost channel layers 24 and then forming the top sacrificial layers 26 on top of the insulating wall material acting as an insulating interface layer 47 before finalizing the formation of the insulating wall 46.

In the above the inventive concept has mainly been described with reference to a limited number of examples. However, as is readily appreciated by a person skilled in the art, other examples than the ones disclosed above are equally possible within the scope of the inventive concept, as defined by the appended claims.

The invention claimed is:

1. A method for forming a semiconductor device, the method comprising:
forming a device layer stack on a substrate, the device layer stack comprising an alternating sequence of lower sacrificial layers and channel layers, and a top sacrificial layer over a topmost one of the channel layers, wherein the top sacrificial layer and the lower sacrificial layers are silicon-germanium layers, wherein the top sacrificial layer is thicker than each lower sacrificial layer;

forming a sacrificial gate structure on the top sacrificial layer, the sacrificial gate structure extending across the device layer stack;
etching the top sacrificial layer while using the sacrificial gate structure as an etch mask to form a top sacrificial layer portion underneath the sacrificial gate structure;
forming a first spacer on opposite sidewalls of the sacrificial gate structure and on end surfaces of the top sacrificial layer portion;
etching the channel layers and lower sacrificial layers while using the sacrificial gate structure and the first spacer as an etch mask to form channel layer portions and lower sacrificial layer portions underneath the sacrificial gate structure;
etching the lower sacrificial layer portions to form recesses in the device layer stack on opposite sides of the sacrificial gate structure, while the first spacer masks the end surfaces of the top sacrificial layer portion; and
forming a second spacer in the recesses, comprising conformally depositing dielectric material and using an isotropic etch to etch the conformally deposited dielectric material such that end surfaces of the channel layer portions, including end surfaces of a topmost channel layer portion, are exposed on opposite sides of the sacrificial gate structure and the dielectric material remains in the recesses to form the second spacer.

2. A method according to claim 1, further comprising, after forming the second spacer, forming source and drain regions by epitaxially growing semiconductor material on the exposed end surfaces of the channel layer portions.

3. A method according to claim 1, further comprising, after forming the second spacer, forming a gate stack by replacing the sacrificial gate structure with a gate stack.

4. A method according to claim 1, wherein the isotropic etch used while forming the second spacer is selective for the conformally deposited dielectric material rather than the material of the first spacer.

5. A method according to claim 1, wherein the etching of the top sacrificial layer extends completely through the top sacrificial layer.

6. A method according to claim 5, wherein the device layer stack further comprises an insulating interface layer between the top sacrificial layer and the topmost channel layer;
wherein while etching the top sacrificial layer, the insulating interface layer acts as an etch stop.

7. A method according to claim 1, wherein the forming of the first spacer comprises conformally depositing a first spacer material and subsequently anisotropically etching the first spacer material such that the first spacer material is removed from horizontally oriented surfaces and remain on vertically oriented surfaces, the vertically oriented surfaces comprising both outer sidewalls of the device layer stack.

8. A method according to claim 1, wherein the device layer stack is formed by a stack of nanowires or by a stack of nanosheets.

9. A method according to claim 1, wherein the device layer stack is a first device layer stack formed on a first device region of the substrate and the method further comprises:
forming a second device layer stack on a second device region of the substrate, the second device layer stack comprising an alternating sequence of lower sacrificial layers and channel layers, and a top sacrificial layer over a topmost one of the channel layers, wherein the top sacrificial layer and the lower sacrificial layers are silicon-germanium layers, wherein the top sacrificial layer is thicker than each lower sacrificial layer, the first and second device layer stacks being spaced apart by a trench filled with an insulating wall material to form an insulating wall;

forming a sacrificial gate structure extending across the first and second device layer stacks and the insulating wall;

etching the top sacrificial layer of the second device layer stack while using the sacrificial gate structure as an etch mask to form a top sacrificial layer portion underneath the sacrificial gate structure;

etching the channel layers and lower sacrificial layers of the second device layer stack while using the sacrificial gate structure and the first spacer as an etch mask to form channel layer portions and lower sacrificial layer portions underneath the sacrificial gate structure; and etching the lower sacrificial layer portions to form recesses in the second device layer stack on opposite sides of the sacrificial gate structure, while the first spacer masks the end surfaces of the top sacrificial layer portions.

10. A method according to claim 9, further comprising, after forming the second spacer, forming source and drain regions by epitaxially growing semiconductor material on the exposed end surfaces of the channel layer portions;

wherein the source and drain regions of the first device layer stack are n-doped and the source and drain regions of the second device layer stack are p-doped.

11. A method according to claim 9, wherein the forming of the first spacer comprises conformally depositing a first spacer material and subsequently anisotropically etching the first spacer material such that the first spacer material is removed from horizontally oriented surfaces and remain on vertically oriented surfaces, the vertically oriented surfaces comprising an outer sidewall of each of the first and second device layer stacks.

12. A method according to claim 1, wherein the lower sacrificial layers have a uniform thickness.

13. A method according to claim 9, further comprising:

removing the sacrificial gate structure extending across the first and second device layer stacks and the insulating wall, to form a gate trench;

selectively removing lower and top sacrificial layer portions from the gate trench;

forming a gate stack in the gate trench, in the space left by removing the top sacrificial layer portion, the lower sacrificial layer portions and the sacrificial gate structure.

14. A method according to claim 13, wherein, for each channel layer:

the gate stack abuts the channel layer on an upper side of the channel layer, on a lower side of the channel layer, and on a first lateral side of the channel layer, wherein a second lateral side of the channel layer is opposite to the first lateral side and abuts the insulating wall.

15. A method according to claim 1, wherein the sacrificial gate structure comprises amorphous silicon.

* * * * *